United States Patent [19]

Ciobanu et al.

[11] Patent Number: 5,544,992
[45] Date of Patent: Aug. 13, 1996

[54] PANEL FASTENER HAVING COMPOSITE TURNING KNOB

[75] Inventors: Dan A. Ciobanu, Buema Park; Karl Mladinich, San Pedro, both of Calif.

[73] Assignee: Huck International, Inc., Irvine, Calif.

[21] Appl. No.: 288,822

[22] Filed: Aug. 11, 1994

[51] Int. Cl.$^6$ .............. F16B 21/18; F16B 39/00
[52] U.S. Cl. .......... 411/353; 411/107; 411/999; 411/402; 411/375
[58] Field of Search .................. 411/352, 353, 411/999, 970, 402, 153, 533, 544, 107, 108, 109, 371, 956; 74/553; 5/373, 375, 377

[56] References Cited

U.S. PATENT DOCUMENTS

| | | | |
|---|---|---|---|
| 2,270,813 | 6/1942 | Olson | 411/533 |
| 2,735,470 | 2/1956 | Poupitch | 411/533 |
| 2,826,231 | 3/1958 | Alden | 411/999 |
| 3,346,032 | 10/1967 | Gulistan | 411/999 |
| 4,387,497 | 6/1983 | Gulistan | 411/107 |
| 4,655,658 | 4/1987 | Gulistan | 411/353 |
| 4,957,317 | 9/1990 | Jakubas | 411/402 |
| 5,338,139 | 8/1994 | Swanstrom | 411/353 |
| 5,382,124 | 1/1995 | Frattarola | 411/352 |

*Primary Examiner*—Flemming Saether
*Attorney, Agent, or Firm*—Harness, Dickey & Pierce, P.L.C.

[57] ABSTRACT

A panel fastener having a turning knob which is attached to a stud in a positive locking relationship. The stud has a shaft with an enlarged stud head and a deformable lip at one end and a threaded region at the opposite end. The hollow cylindrical knob has an interior annular ridge extending radially inwardly from the inside surface of the knob thereby defining an opening through the knob. The stud extends through the ridge opening and the stud head rests on one surface of the ridge and the lip extends from the stud head through the ridge opening and is deformed to engage the ridge to permanently attach the knob to the stud. The stud head has protrusions extending radially from its circumference which positively engage a similarly shaped recess in the knob. The knob is made of a composite material that resists cracking during assembly and reduces corrosion during use.

13 Claims, 3 Drawing Sheets

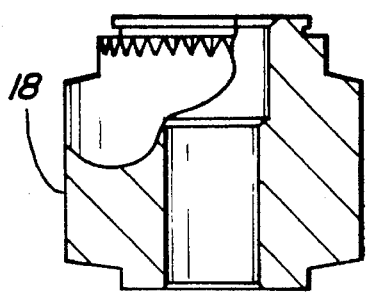
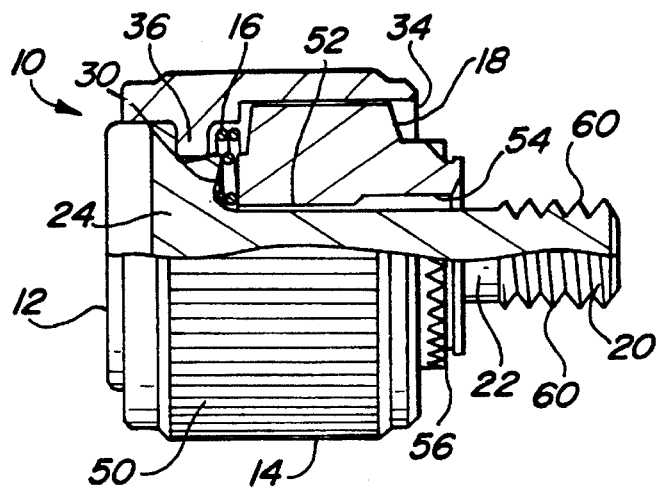
*Fig - 2B*
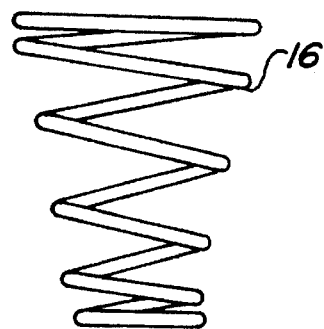
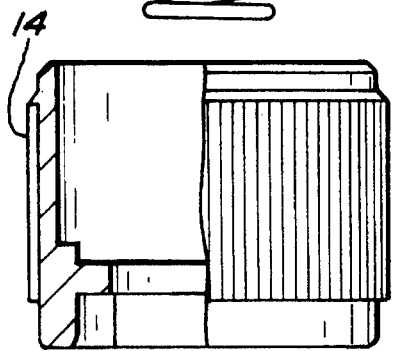
*Fig - 1*
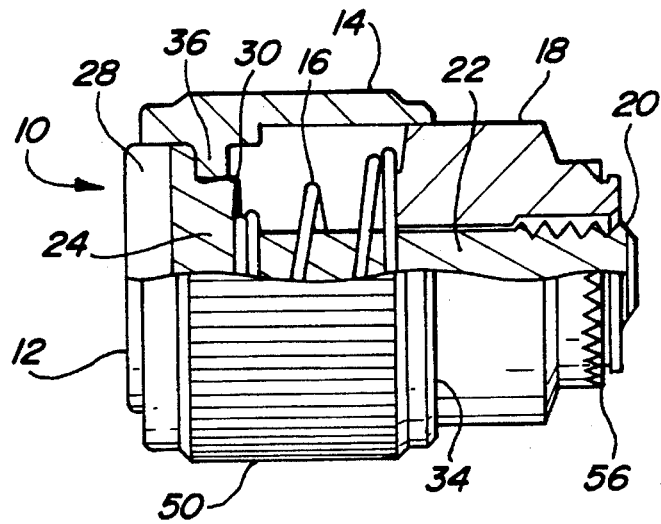
*Fig - 2A*
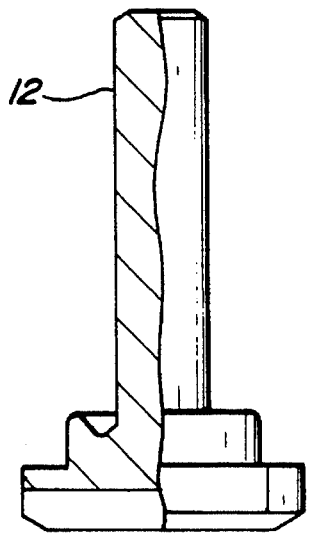

PANEL FASTENER HAVING COMPOSITE TURNING KNOB

BACKGROUND OF THE INVENTION

The present invention relates to panel fasteners and, more particularly, to a panel fastener having a composite turning knob for use in the electronics field to install electronic equipment into equipment racks and the like. A panel fastener simplifies the installation or removal of the equipment from the racks.

Racks for mounting electronic equipment usually are organized into bays having frames to hold the equipment. The frames of each bay typically have predrilled holes spaced apart at standard distances. The electronic equipment is of a standard size designed to fit in the frames and has holes designed to align with the corresponding holes in the frames. A threaded fastener is used to secure the equipment to the frame.

Installing electronic equipment into a frame can be difficult since a technician must simultaneously hold the equipment, align the holes and thread the fastener into a corresponding threaded hole. In addition, the technician must hold the fastener substantially perpendicular to the threaded hole and must apply a small amount of insertion force to insert a threaded stud of the fastener into the threaded hole, while simultaneously rotating the stud.

To overcome the difficulties encountered with conventional threaded fasteners, so-called panel fasteners have been developed to simplify the equipment installation process. The panel fastener has a turning knob that allows for easy handling and tightening of the fastener with the fingers. A conventional panel fastener has a threaded stud or screw, a spring, a sleeve and a turning knob to allow the fastener to be inserted and tightened by hand. Thus, a piece of equipment is installed in an equipment rack by positioning the threaded portion of the shaft through a threaded hole in the equipment rack's frame and tightening the fastener by pressing the knob inward, compressing the spring, and rotating the knob to engage the threaded hole. The top of the knob is open, leaving the stud head exposed to allow final tightening by a screwdriver, if desired. The spring keeps a continuous withdrawal force on the fastener stud to facilitate removal of the panel fastener.

In panel fasteners of the type described above, the knob usually is made of aluminum and the stud or screw is made of steel. The circumference of the stud head also has a serrated or knurled outer surface with an outside diameter slightly larger than the inside diameter of the cylindrical aluminum knob. To assemble the fastener, the steel stud is inserted axially into the knob, causing the serrations or knurling on the stud head to frictionally engage the inner surface of the knob. Rotation between the stud head and the knob therefore is prevented primarily by the interference fit, and corresponding frictional engagement, created by the serrations or knurling, between the steel stud head and the softer aluminum knob. The aluminum knob is then swaged over the top outside edge of the stud head to prevent axial movement of the stud with respect to the knob.

Since the aluminum knob and the steel stud are made of dissimilar materials, there is a tendency for corrosion to occur between the two metals in certain environments. In addition, there is a tendency for the knob to crack when pressed and swaged over the stud since the stud head has an outside diameter that is slightly larger than the inside diameter of the knob. Another disadvantage of the prior panel fasteners is the inability of the interference fit to positively prevent rotation between the stud head and the knob when a large rotational torque is applied to the knob. In this regard, once the knob is rotated with respect to the stud head, the softer aluminum knob is damaged and the interference fit and frictional engagement between the stud head and knob is effectively destroyed. The knob will then rotate on the stud head when tightening forces are applied, and most of the advantages of the panel fastener are lost unless the entire panel fastener assembly is replaced. Also, if the knob is broken off of the stud, the stud is no longer captured in the assembly and can be forced out of the assembly by the spring.

Accordingly, there has existed a definite need for a panel fastener having a turning knob that has a positive locking engagement with the stud head, that is corrosion resistant, and that avoids cracking during assembly. There also has existed a need for a panel fastener in which the stud remains captured in the remaining assembly if the knob is broken off of the stud. The present invention satisfies these needs and provides further related advantages.

SUMMARY OF THE INVENTION

The present invention is embodied in a panel fastener for use in installing equipment and the like into equipment racks. The fastener includes a stud having a shaft with an enlarged stud head at one end and a threaded region at the opposite end. The fastener also includes a hollow turning knob designed to fit onto the stud head in a positive locking relationship. The positive locking relationship between the stud head and the knob allows a relatively large rotational torque to be applied between the knob and the stud head without permanently damaging the knob. The fastener also can withstand a large compressive force that is applied to the fastener during installation into a metal plate.

In one embodiment of the invention, the stud head has a deformable lip extending away from the stud head in a direction generally parallel to an axis defined by the stud shank. The hollow turning knob has a top opening, a bottom opening, and an interior annular rib or ridge extending inwardly from the knob's inside surface. The ridge has a top surface facing generally in the direction of the top opening, a bottom surface facing generally in the direction of the bottom opening and an interior edge that defines an opening through the ridge centered about an axis through the interior of the knob. The ridge opening has a sufficiently large diameter for the shank of the stud to pass therethrough. The stud head is located so that the stud head contacts a top surface of the knob or the top surface of the ridge and the lip is deformed in a radially outward direction to overengage the ridge to axially retain the stud within the knob.

In one aspect of the invention, a plurality of protrusions are spaced around the circumference of the stud head to provide the stud head with a non-circular cross-section. The protrusions can be equally spaced with the stud head having a polygonal shape. The knob has a recess within its top opening that is shaped to engage the protrusions on the stud head to prevent rotation of the knob about the axis of the stud. The fit between the protrusions and the shaped recess provide generally mating engagement and a positive locking interface between the stud head and the knob that is more durable and rugged than an interference fit.

In a more detailed feature of the invention, the stud head has an octagonal shape. The corners of the octagonal shape form the protrusions discussed above. Likewise, the recess in the knob also has an octagonal shape that fits the octagonal shape of the stud head, thereby preventing rotation of the knob with respect to the stud.

In addition, the knob can be made from a composite material and the stud can be made from a steel material. This prevents corrosion between the stud and knob that tends to occur in certain environments if the stud and knob are made of dissimilar metals.

In another more detailed feature of the invention, the diameter of the stud head is larger than the diameter of the opening defined by the annular ridge, such that the stud head rests against the top surface of the ridge and the lip extends beyond the bottom surface of the ridge in an axial direction. By this arrangement, a portion of the lip that extends past the ridge can be deformed in a radial direction until the lip has a radial diameter larger than the radial diameter of the opening defined by the ridge. Thus, the ridge is captured between the stud head and the lip, thereby permanently attaching and preventing axial movement of the stud with respect to the knob.

In another embodiment of the invention, the panel fastener discussed above further includes a cylindrical sleeve having a bore through its center. The shank of the stud is sized to fit through the bore. Further, the fastener may include a conical spring to bias the stud away from the sleeve. To prevent the stud from being pushed out of the sleeve by the spring, the stud may include threads having crests with a diameter larger than at least a portion of the diameter of the bore through the sleeve. Thus, the stud can be permanently captured within the sleeve with the spring confined between the stud head and the sleeve. The sleeve, as assembled, can then be mounted into a panel to permanently secure the fastener to the panel.

To assemble the knob onto the stud head, the shank of the stud is inserted axially through the top opening in the knob until the stud head engages the recess in the top opening of the knob. Next, the lip is swaged causing the lip to expand radially outwardly to overengage the ridge of the knob. The spring is then axially inserted over the stud shank until it contacts the stud head. After this, the sleeve is axially inserted over the stud shank which confines the spring between stud head and the sleeve. Threads are then rolled onto that portion of the end of the shank that extends through the sleeve. During rolling, crests are formed on the shank to create the threads. After rolling, the crests of the threads have a diameter larger than the inside diameter of a portion of the sleeve, thereby permanently capturing the shank and hence to stud to the sleeve. In this regard the U.S. Pat. No. 3,571,904 issued Mar. 31, 1971 to Gulistan for "Arrangement For Captive Screw" shows a similar method of capturing a screw to a sleeve by thread forming after assembly of the components.

Other features and advantages of the present invention will become apparent from the following detailed description, taken in conjunction with the accompanying drawings, which illustrate, by way of example, the principles of the invention.

BRIEF DESCRIPTION OF THE DRAWINGS

FIG. 1 is an exploded view of a panel fastener embodying the novel features of the present invention;

FIG. 2A is an elevational view, partly in cross section, showing the assembled fastener;

FIG. 2B is an elevational view, partly in cross section, showing the assembled fastener in the engaged position.

DESCRIPTION OF THE PREFERRED EMBODIMENT

Figure 2C:
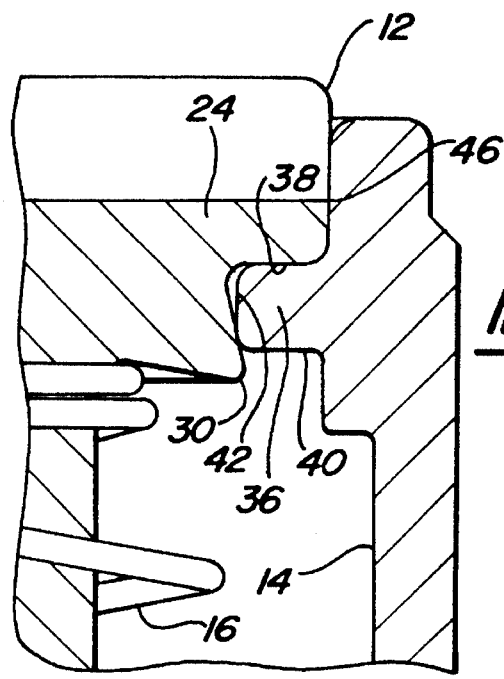
FIG. 2C is an elevational view, partly in cross section showing a portion of the assembled fastener shown in FIG. 2A in greater detail.
Figure 3:
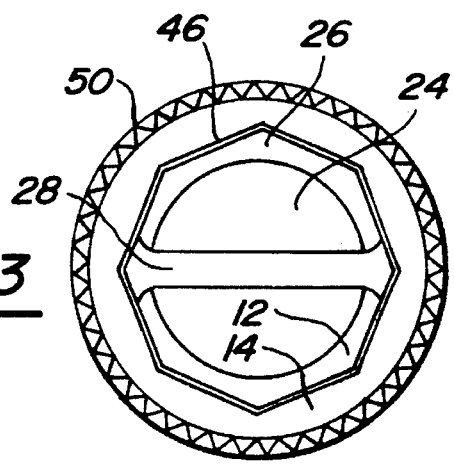
FIG. 3 is a top plan view of the assembled fastener shown in FIG. 2A.

As shown in the exemplary drawings, the present invention is embodied in a panel fastener, generally referred to by the reference numeral 10, for use in installing equipment into equipment racks and the like. Referring to FIG. 1, the panel fastener 10, in accordance with the invention, is shown in an exploded view prior to assembly. In particular, a stud or screw 12, a turning knob 14, a conical spring 16 and a sleeve 18 are shown aligned along a common axis. To assemble the fastener 10, the stud 12 is inserted axially into the knob 14 and a portion of the stud 12 is swaged to permanently attach the knob 14 to the stud 12, as explained in more detail below. Thereafter, the stud 12, with the permanently attached knob 14, is inserted axially through the coil spring 16 and the sleeve 18. Threads 20 are then formed by rolling on the shank 22 of the stud 12 to permanently capture the stud 12 within the sleeve 18 along with spring 16.

The assembled fastener 10 is shown FIGS. 2A–2C and 3. In accordance with the invention, a positive mating engagement between similarly formed irregular surfaces on the stud 12 and the knob 14 prevents the knob 14 from rotating with respect to the stud 12. The stud 12 is biased away from the sleeve 18 by the spring 16. After assembly, threads 20 are rolled onto the stud 12 to secure the stud 12 and sleeve 18 from axial separation. In addition to engaging a threaded hole for securing an article to an equipment rack or the like, the threads also prevent the spring 16 from pushing the stud 12 out of the sleeve 18.

Figure 5:
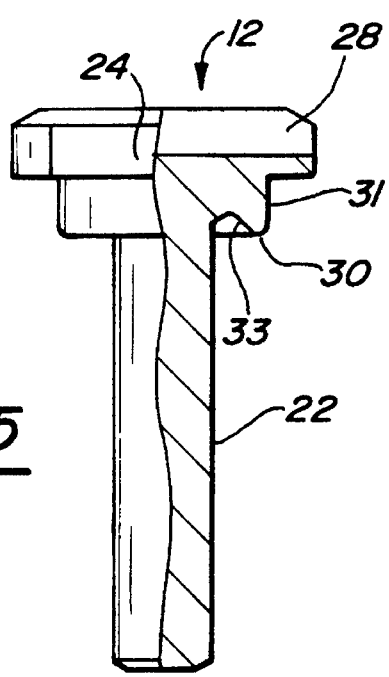
FIG. 5 is an elevational view, partly in cross section of the stud shown in FIG. 4 prior to assembly and thread formation.
Figure 4:
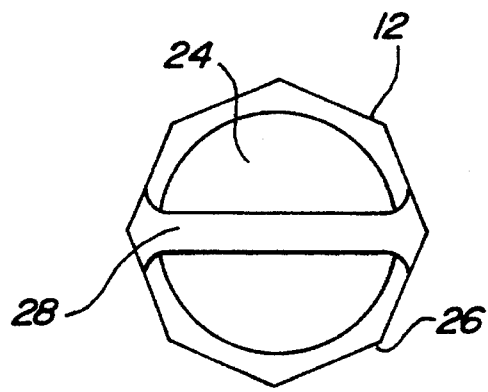
FIG. 4 is a top plan view showing the head of a stud of the fastener.

Referring now to FIGS. 4 and 5, the stud 12 comprises a shank 22 having an enlarged stud head 24 at one end. The stud head 24 is polygonally shaped and preferably has an octagonal shape formed by eight flat sides along the circumference of the disk-shaped stud head 24. The corners of the flat sides of the octagonal shape define eight protrusions 26 which extend beyond the flat sides. The stud head 24 may have a greater or smaller number of flat sides and correspondingly a greater or smaller number of protrusions 26. The stud head 24 also has a diametrically extending screwdriver slot 28 designed to receive a screwdriver blade (not shown), such as a flat screwdriver blade. The stud 12 includes a deformable annular lip 30 extending axially from a reduced diameter boss 31 located under the stud head 24. The lip 30, extending axially in the direction of the shank 22, has a constant outside diameter about the central axis of the shank 22 and is radially spaced from the confronting portion of the shank 22 by an annular, tapered surface 33. The deformable lip 30 is swaged during assembly of the fastener to retain the knob 14 as will be explained below. The stud 12 preferably is manufactured from steel materials and before assembly, the shank 22 is formed with a smooth uniform diameter.

Figure 6:
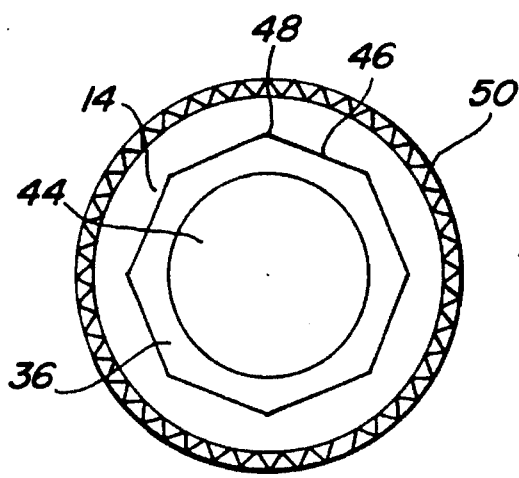
FIG. 6 is a top plan view showing a turning knob of the fastener prior to assembly.
Figure 7:
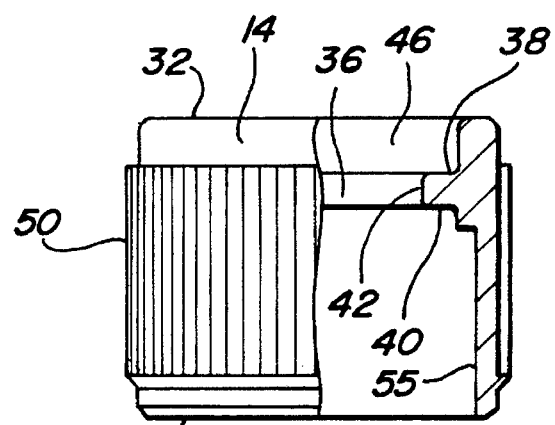
FIG. 7 is an elevational view, partly in cross section, of the turning knob shown in FIG. 6.

The turning knob 14, shown in FIGS. 6 and 7, has a hollow cylindrical shape with a top opening 32, a bottom opening 34, and an interior annular rib or ridge 36 located on the inside surface of the knob 14. The interior ridge 36 extends radially inwardly from the inside surface of the knob 14 and has a top surface 38 facing in the direction of the top opening 32, a bottom surface 40 facing in the direction of the bottom opening 34 and a circular interior edge 42. The radially inner edge 42 of rib or ridge 36 defines an opening 44 through the knob 14 of a diameter large enough to receive the boss 31 with the lip 30 of the stud 12 prior to the swaging of the lip 30, but small enough to block the stud head 24 from passing therethrough.

In the preferred embodiment, the turning knob 14 has an octagonally shaped recess 46 at its top surface 38 for generally matably receiving the similarly shaped stud head 24 within the top opening 32. The corners 48 of the octagonal shape of recess 46 are adapted to engage the protrusions 26 of the stud 12 to prevent relative rotational motion between the knob 14 and the stud 12. Again, however, a greater or smaller number of corners may be used in the recess 46 depending on the number of protrusions that are used on the stud head. In addition, the turning knob 14 preferably is constructed from composite materials and/or other suitable plastic materials and has a knurled outer surface 50 to facilitate grasping and hand tightening of the fastener 10 by a user. Alternatively, a screwdriver (not shown) can be used in conjunction with the screwdriver slot 28 in the stud head 24 to tighten the fastener.

Figure 8:
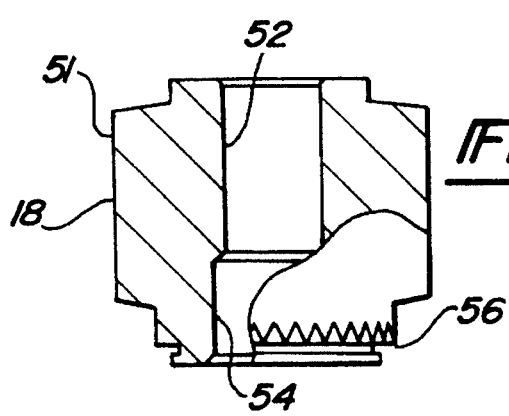
FIG. 8 is an elevational view, partly in cross section, showing a sleeve of the fastener prior to assembly.

With reference now to FIG. 8, the sleeve 18 is of a generally cylindrical radially stepped shape having a large diameter central body portion 51. A bore 52 extends through the sleeve 18 along its central axis. The bore 52 is large enough for the shank 22 of the stud 12 to pass therethrough before the threads 20 are formed on the shank 22. The bore 52 preferably has a counterbore 54 that has a diameter large enough to accommodate the threads 20 on the shank 22. The outside diameter of the body portion 51 of the sleeve 18 is smaller than inside diameter of the bore portion 55 of the knob 14 extending inwardly from the bottom opening 34. If desired, the sleeve 16 can be used to mount the fastener 10 to a metal plate (not shown) by press fitting a serrated outer end 56 of sleeve 18 into a hole in the plate, in a conventional manner.

Figure 9:
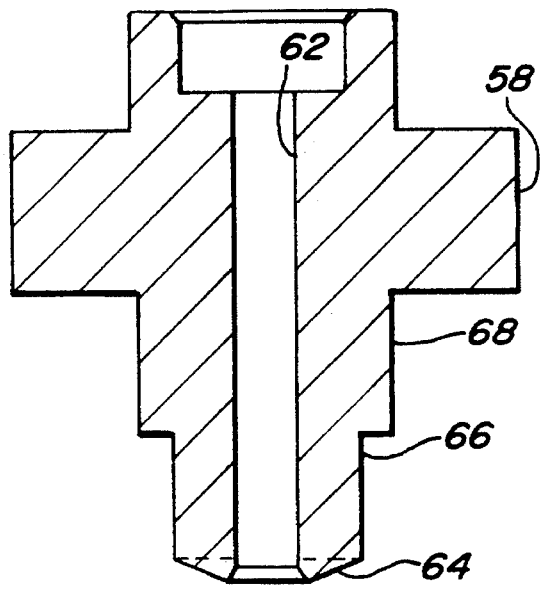
FIG. 9 is sectional view of a swaging tool for use in assembly of the fastener.

A tool 58 for swaging the deformable lip 30 is shown in FIG. 9. A portion of the swaging tool 58 fits within the bore portion 55 moving through the bottom opening 34 of the knob 14 and can be used to apply a force to the lip 30 sufficient to swage the lip 30 radially outwardly to generally overengage the bottom surface 40 of the rib or ridge 36.

Referring again to FIGS. 2 and 3, the fastener 10 is assembled by inserting the shank 22 of the stud 12 axially through the knob 14 until the stud head 24 is in engagement with the top surface 38 of the interior ridge 36. The swaging tool 58 is then moved into the bore portion 55 through the bottom opening 34 of the knob 14. While the top of the stud head 24 is firmly supported, the deformable lip 30 is swaged by the tool 58. During swaging, the lip 30 is deformed radially outwardly to overengage the bottom surface 40 of the interior ridge 36. After swaging, a portion of the lip 30 that extends past the ridge 36 has a diameter greater than the diameter of the ridge opening 42 thereby permanently securing the knob 14 to the stud 12.

In this regard the swaging tool 58 has a through bore 62 adapted to receive the stud shank 22 with the knob 14 located on the stud shank 22 and with the boss 31 located within the ridge opening 42 of the ridge 36. The tool 58 is moved over the stud shank 22 until a tapered, swage surface 64 of a reduced outer end portion 66 engages the tapered inner surface 33 of the lip 30. An intermediate diameter portion 68 of the tool 58 is of a diameter to fit with a generally slight clearance within the bore portion 55 at the outer end of the knob 14 whereby the tapered, swage surface 64 of the reduced diameter end portion 66 is guided into engagement with the tapered inner surface 33 of lip 30. Upon the application of sufficient axial force to the tool 58 against the stud 12 the lip 30 will be deformed or swaged radially outwardly to overengage the bottom surface 40 of the ridge 36 to axially lock the stud 12 and knob 14 together. At the same time the stud head 24 will be held within the recess 46 of the knob 14 whereby relative rotation between the two members is prevented by the interaction of the octagonal mating surfaces. Note that the tapered swage surface 64 of the tool 58 and the tapered inner surface 33 of the lip 30 are generally similarly inclined to facilitate radial deformation of the lip 30 radially outwardly to its locking position.

Next the conical spring 16 is placed on the shank 22 with the smaller diameter end of the spring 16 resting against the boss 31 of the stud head 24. The sleeve 18 is then placed on to the shank 22 and moved axially within the bore portion 55 of the knob 14 compressing the spring 16.

When the spring 16 is fully compressed, the shank 22 extends past the outer end of the sleeve 18 a sufficient distance such that threads 20 can be rolled thereon. The threads 20 as rolled onto the shank 22 have crests 60 that are formed to a diameter larger than the diameter of the smaller diameter bore 52 through the sleeve 18. Thus, the stud 12 is permanently captured with the sleeve 18 by the interference between the diameter of the bore 52 and the diameter of the crests 60 of the threads 20. The counterbore 54 in the sleeve 18 preferably has a diameter sufficiently larger than the diameter of the crests 60 of the threads 20 such that the threads 20 on the shank 22 will be resiliently biased to a position within the counterbore 54 of the sleeve 14 when the fastener 10 is not in use. In this way the threads 20 are generally protected when the fastener 10 is not being used. See the U.S. '904 Patent to Gulistan, supra.

The use of spring 16 of a conical construction allows the assembly to be more compact since when the spring 16 is completely compressed the individual coils can generally nest within each other whereby the spring 16 will have a compressed thickness generally no greater than the diameter of one wire. In this regard it can be seen from FIG. 2A that the larger ones of the coils of spring 16 can be received around the boss 31 of the stud head 24 to facilitate compression to its minimum size. Also, since the conical spring 16 is generally flat when completely compressed, the fastener 10 can withstand the large compression forces that are used to install the sleeve 18 into a metal plate (not shown).

The stud 12 can be made of a suitable metal such as CRS Steel per ASTM-A-493 or AMS 5636(302). The sleeve 18 also can be made of a suitable metal such as an Aluminum Alloy per QQ-A-225/9 or AMS 4122 (7075-T6). The coil spring 16 can be made of a suitable metal such as CRES Steel per QQ-W-423, Cond B or AMS 5688 (302). As noted the turning knob 14 can be made by molding from a suitable plastic or composite material such as engineered composite material per DMS C-100-REV A.

In one form of the invention, where the diametrical dimension across the flats was around 5/16 inch, the positive locking engagement between the protrusions 26 of stud head 24 and the corresponding recess 46 of the knob 14 could withstand as much as 15 inch pounds of torque on the knob 14 with respect to the stud head 24.

Advantageously, the stud head 24 does not induce radial stress on the knob 14 since the recess 46 of the knob 14 is sized to be slightly larger than the size of the stud head 24. Thus, the knob 14 is less likely to become cracked or damage during assembly.

As noted, in the prior art panel fasteners, the knob is swaged over the stud head and therefore is subject to cracking and damage, thus decreasing the structural integrity of the overall fastener. In the fastener 10 of the present invention, however, the knob 14 is not swaged. Instead, the deformable lip 30 on the stud 12 is swaged to overengage the interior ridge 36 of the knob 14. Swaging the lip 30 on the stud 12 is less likely to cause the knob 14 to develop the kind of structural fatigue that produces cracks or other stresses that could lead to failure of the knob 14.

Another significant advantage of the fastener 10 of the present invention is the use of composite material to make the knob 14. In the prior art panel fasteners, the knob typically is made of aluminum and the stud is made of steel. Hence, these dissimilar metals tend to promote undesirable corrosion. However, the opportunity for corrosion is eliminated in the fastener 10 of the present invention, since the composite material of the knob 14 will not promote corrosion with the steel material of the stud 12. Thus, the fastener 10 will enjoy an increased life in a potentially corrosive environment.

Additionally, in the fastener 10 of the present invention, if the knob 14 is broken off from the stud 12, the stud 12 remains captured in the sleeve 18 by the threaded portion and the remaining portion of the fastener is still substantially functional. Also, in the prior art panel fasteners, the swaged portion of the knob is exposed and its aesthetic appearance is an important consideration. In the panel fasteners 10 of the present invention, the swaged lip 30 of the stud 12 is hidden within the knob 14 and its aesthetic appearance is not a very important consideration.

While it will be apparent that the preferred embodiments of the invention disclosed are well calculated to fulfill the objects above stated, it will be appreciated that the invention is susceptible to modification, variation and change without departing from the proper scope or fair meaning of the invention.

What is claimed is:

1. A fastener, comprising:

a hollow cylindrical turning knob having an axial length between a top opening and a bottom opening, and an interior ridge extending radially inwardly from an inside surface, of said knob at a location axially spaced from said top opening and said bottom opening, the interior ridge having a top surface generally facing in the direction of the top opening, a bottom surface generally facing in the direction of the bottom opening, and an interior edge that defines an opening through said ridge;

a stud having a shank with a central axis and with an enlarged stud head at one end, said shank extending through said knob with said stud head being engageable with said top surface of said ridge, said stud head having a deformable lip which extends axially from said stud head in a direction generally parallel to said central axis of said shank and which extends axially past said ridge, said lip being deformed radially outwardly to overengage said bottom surface of said ridge and to locate said lip radially beyond said ridge opening and thereby axially retain said stud and said knob together; and rotational restraining means on said stud and said knob for preventing relative rotational movement between said knob and said stud about the central axis of said shank.

2. A fastener as defined in claim 1, with said rotational restraining means comprising:

a portion of said stud head having a non-circular cross-section; and a recess in said knob adapted to generally matably receive said portion of said stud head having a non-circular cross-section to provide a positive radial engagement between said knob and said stud thereby preventing relative rotational movement between said knob and said stud, said recess being axially substantially opened relative to said stud head.

3. A fastener as defined in claim 1, with said rotational restraining means comprising:

said stud head being located at the outer terminal of said shank and having a polygonal shape including a plurality of corners forming protrusions that extend in a radial direction perpendicularly to the central axis of said shank; and a polygonally shaped recess in said knob adapted to generally matably receive said polygonally shaped stud head to provide a positive radial engagement between said knob and said stud thereby preventing relative rotational movement between said knob and said stud.

4. A fastener as defined in claim 1, with said rotational restraining means comprising:

said stud head being located at the outer terminal end of said shank and having an octagonal shape with eight corners forming protrusions that extend in a radial direction perpendicularly to the central axis of said shank; and an octagonally shaped recess in said top opening of said knob adapted to generally matably receive said octagonally shaped stud head to provide a positive radial engagement between said knob and said stud thereby preventing relative rotational movement between said knob and said stud.

5. A fastener comprising:

a hollow cylindrical turning knob having an axial length between a top opening and a bottom opening, and an interior ridge extending radially inwardly from an inside surface of said knob at a location axially spaced from said top opening and said bottom opening, said interior ridge having a top surface generally facing in the direction of said top opening, a bottom surface generally facing in the direction of said bottom opening, and an interior edge that defines an opening through said ridge;

a stud having a shank with a central axis and with an enlarged stud head at one end, said shank extending through said knob with said stud head engaging said top surface of said ridge, said stud head having a deformable lip which extends from said stud head in a direction substantially parallel to said central axis of said shank and which extends axially past said ridge, said lip being deformed radially outwardly to overengage said bottom surface of said ridge and to locate said lip radially beyond said ridge opening and to thereby provide the sole axial connection between said stud and said knob, the stud head including a plurality of protrusions extending from said stud head in a radial direction perpendicularly to said central axis of said shank, and said knob including a recess within said top opening adapted to receive and to engage said protrusions to provide a positive radial engagement with said protrusions thereby preventing relative rotational movement between said knob and said stud.

6. A fastener as defined in claim 5, wherein:

said plurality of protrusions define a polygonal shape with the corners of said polygonal shape forming said plurality of protrusions; and said knob having a recess adapted to generally matably receive said polygonally shaped stud head to provide a positive radial engagement between said stud and said knob, said recess being substantially opened axially relative to said stud head.

7. A fastener as defined in claim 5, wherein:

said plurality of protrusions define an octagonal shape, the corners of said octagonal shape forming eight protrusions; and said knob having a recess adapted to generally matably receive said octagonally shaped stud head to provide a positive radial engagement between said stud and said knob, said recess being substantially opened axially relative to said stud head.

8. A fastener as defined in claim 5, further comprising:

a cylindrical sleeve having a sleeve bore therethrough, said sleeve bore adapted to receive said shank, said stud being made of a deformable metallic material and said knob being made of a deformable, non-metallic material.

9. A fastener as defined in claim 8, further comprising:

a conical spring adapted to engage said stud head to bias said stud away from said sleeve; said spring having coils of decreasing diameter from the end engaging said stud head to its opposite end whereby said conical spring can be compressed to a substantially minimum axial length; and wherein the end of said shank opposite the end having said stud head has threads with an outside diameter larger than at least a portion of the diameter of said sleeve bore thereby permanently capturing said stud within said sleeve.

10. A fastener as defined in claim 9, wherein said sleeve includes a counterbore extending into the end of said sleeve adjacent to said threads, said counterbore having a diameter larger than the diameter of said threads such that at least a portion of said threads can enter into said counterbore of said sleeve.

11. A fastener as defined in claim 5, wherein said stud is made of a deformable metal and said knob is made of a composite material.

12. A fastener comprising:

a stud having a shank with an enlarged stud head at one end of said shank and a plurality of threads at the opposite end, said stud head having a plurality of protrusions extending radially therefrom and said threads having a crest diameter slightly larger than the diameter of the remainder of said shank, said stud including a lip that extends axially from said stud head;

a cylindrical sleeve having a sleeve bore therethrough, said sleeve bore having a diameter that is larger that the diameter of said remainder of said shank and smaller than the diameter of said crests of said threads on said shank, said shank captured within said sleeve bore such that said stud head extends from one end of said sleeve and said threads extend from the other end of said sleeve;

a hollow cylindrical knob having a top opening, a bottom opening, a recess in the top opening, and an annular interior ridge extending radially inwardly from the inside cylindrical surface between said top opening and said bottom opening, said interior ridge having a top surface generally facing in the direction of said top opening, a bottom surface generally facing in the direction of said bottom opening, and a circular interior edge defining an opening through said ridge, said shank and said lip extending through said ridge, said lip being swaged radially outwardly such that a portion of said lip has a larger diameter than the diameter of said ridge opening to prevent axial movement between said stud and said knob, and said recess adapted to positively engage said plurality of protrusions to prevent axial rotational movement of said knob relative to said stud about an axis defined by said shank, and a conical spring for biasing said stud head axially away from said sleeve, said spring adapted to fit over said shank and inside said knob, wherein said spring is partially compressed and axially confined between said stud head and said sleeve.

13. A method of assembling a panel fastener having a stud with a shank with threads at one end of the shank and an enlarged stud head at the other end of the shank, the stud head having a deformable lip extending axially therefrom, a hollow turning knob having a top opening, a bottom opening, and an annular ridge extending from the inside surface of the knob, the ridge having a top surface generally facing in the direction of the top opening and a bottom surface generally facing in the direction of the bottom opening, the ridge defining an opening through the knob, a cylindrical sleeve having a sleeve bore therethrough, and a spring, the method comprising the steps of:

inserting the shank of the stud axially through the knob until the stud head engages a recess in the knob and the lip extends through the ridge opening;

swaging the deformable lip to cause the lip to expand radially outwardly to overengage the ridge and prevent axial movement between the stud and the knob;

inserting the spring axially over the shank until the spring engages the stud head;

inserting the stud axially through the sleeve bore confining the spring between the stud head and the sleeve;

rolling threads on the end of the shank thereby creating crests having a diameter larger than the inside diameter of a portion of the sleeve, thereby permanently capturing the shank with the sleeve.

* * * * *